(12) United States Patent
Shimabe et al.

(10) Patent No.: US 9,655,249 B2
(45) Date of Patent: May 16, 2017

(54) SUBSTRATE WITH BUILT-IN CAPACITOR AND METHOD FOR MANUFACTURING SUBSTRATE WITH BUILT-IN CAPACITOR

(71) Applicants: IBIDEN CO., LTD., Ogaki-shi (JP); MURATA MANUFACTURING CO., LTD., Nagaokakyo-shi (JP)

(72) Inventors: Toyotaka Shimabe, Ogaki (JP); Masahiro Kaneko, Ogaki (JP); Toshiki Furutani, Ogaki (JP); Takeshi Tashima, Nagaokakyo (JP); Yasuyuki Shimada, Nagaokakyo (JP); Naoki Shimizu, Nagaokakyo (JP)

(73) Assignees: IBIDEN CO., LTD., Ogaki-shi (JP); MURATA MANUFACTURING CO., LTD., Nagaokakyo-shi (JP)

( * ) Notice: Subject to any disclaimer, the term of this patent is extended or adjusted under 35 U.S.C. 154(b) by 24 days.

(21) Appl. No.: 14/644,289

(22) Filed: Mar. 11, 2015

(65) Prior Publication Data
US 2015/0264815 A1    Sep. 17, 2015

(30) Foreign Application Priority Data

Mar. 11, 2014  (JP) ................................. 2014-047430

(51) Int. Cl.
*H05K 1/18* (2006.01)
*H01G 4/008* (2006.01)
(Continued)

(52) U.S. Cl.
CPC .............. *H05K 1/185* (2013.01); *H01G 2/06* (2013.01); *H01G 4/008* (2013.01); *H01L 23/50* (2013.01);
(Continued)

(58) Field of Classification Search
CPC ........ H01G 4/005; H01G 4/008; H01G 4/228; H01G 4/232; H01G 4/2325; H01G 4/30; H01G 4/1227
(Continued)

(56) References Cited

U.S. PATENT DOCUMENTS

2005/0073803 A1\* 4/2005 Cho ................. H01L 21/02178
361/306.1
2010/0328843 A1\* 12/2010 Saruban ............... H01G 4/2325
361/305
(Continued)

FOREIGN PATENT DOCUMENTS

JP        2001-352141 A     12/2001

*Primary Examiner* — Chau N Nguyen
*Assistant Examiner* — Roshn Varghese
(74) *Attorney, Agent, or Firm* — Oblon, McClelland, Maier & Neustadt, L.L.P.

(57) ABSTRACT

A substrate with a built-in capacitor includes an insulating base material layer, a build-up layer formed on the insulating base material layer and including a conductor layer and an insulating layer, and a multilayer ceramic capacitor positioned in an opening of the base material layer and including internal electrodes, ceramic dielectric layers and a pair of external electrodes. The ceramic capacitor has a cuboid shape having long sides and short sides, the pair of external electrodes is formed on opposing long-side sides such that the external electrodes are separated by a distance in range of 30 μm to 200 μm and that each external electrode includes a conductive paste layer connected to a respective group of the internal electrodes and a copper plated layer covering the conductive paste layer, and the conductive paste layer includes Ni paste or Cu paste including glass component in range of 5% to 40%.

20 Claims, 11 Drawing Sheets

(51) Int. Cl.
    *H01G 4/228*   (2006.01)
    *H01G 2/06*    (2006.01)
    *H01L 23/50*   (2006.01)
    *H01G 4/30*    (2006.01)
    *H01G 4/12*    (2006.01)
    *H05K 3/46*    (2006.01)
    *H01L 23/498*  (2006.01)

(52) U.S. Cl.
    CPC ............ *H01G 4/1227* (2013.01); *H01G 4/30* (2013.01); *H01L 23/49816* (2013.01); *H01L 23/49822* (2013.01); *H01L 23/49827* (2013.01); *H01L 2924/0002* (2013.01); *H05K 3/4602* (2013.01); *H05K 2201/068* (2013.01); *H05K 2201/10015* (2013.01); *Y10T 29/43* (2015.01)

(58) Field of Classification Search
    USPC ...................................... 361/306.3
    See application file for complete search history.

(56) References Cited

U.S. PATENT DOCUMENTS

| | | | |
|---|---|---|---|
| 2012/0186866 A1* | 7/2012 | Mikado ................. | H05K 1/185 174/260 |
| 2014/0292142 A1* | 10/2014 | Nishisaka ............... | C03C 8/18 361/301.4 |
| 2014/0367152 A1* | 12/2014 | Lee ....................... | H05K 1/111 361/301.4 |

* cited by examiner

SUBSTRATE WITH BUILT-IN CAPACITOR AND METHOD FOR MANUFACTURING SUBSTRATE WITH BUILT-IN CAPACITOR

CROSS-REFERENCE TO RELATED APPLICATIONS

The present application is based upon and claims the benefit of priority to Japanese Patent Application No. 2014-047430, filed Mar. 11, 2014, the entire contents of which are incorporated herein by reference.

BACKGROUND OF THE INVENTION

Field of the Invention

The present invention relates to a substrate with a built-in capacitor, in which a capacitor is built in the substrate, and to a method for manufacturing the substrate with the built-in capacitor.

Description of Background Art

Japanese Patent Laid-Open Publication No. 2001-352141 describes a substrate with a built-in capacitor, a chip capacitor being built in the substrate. In Japanese Patent Laid-Open Publication No. 2001-352141, electrodes of the chip capacitor are each formed from a metal metalized film, a conductive paste is provided on the metal metalized film, and further the conductive paste is covered by a plating film. Further, in a small chip capacitor, the metalized film is removed, a Cu paste containing a glass component is provided, and a plating film is provided on the Cu paste. The entire contents of this publication are incorporated herein by reference.

SUMMARY OF THE INVENTION

According to one aspect of the present invention, a substrate with a built-in capacitor includes an insulating base material layer, a build-up layer formed on the insulating base material layer and including a conductor layer and an insulating layer, and a multilayer ceramic capacitor positioned in an opening portion of the insulating base material layer and including internal electrodes, ceramic dielectric layers and a pair of external electrodes. The multilayer ceramic capacitor has a cuboid shape having long sides and short sides, the pair of external electrodes is formed on opposing long-side sides such that the external electrodes are separated by a distance in a range of 30 μm to 200 μm and that each of the external electrodes includes a conductive paste layer connected to a respective group of the internal electrodes and a copper plated layer covering the conductive paste layer, and the conductive paste layer includes a Ni paste or a Cu paste including a glass component in a range of 5% to 40%.

According to another aspect of the present invention, a method for manufacturing a substrate with a built-in capacitor includes preparing a multilayer ceramic capacitor including internal electrodes, ceramic dielectric layers and a pair of external electrodes, and positioning the multilayer ceramic capacitor in an opening portion of an insulating base material layer, and forming on the insulating base material layer a build-up layer including a conductor layer and an insulating layer. The multilayer ceramic capacitor has a cuboid shape having long sides and short sides, the pair of external electrodes is formed on opposing long-side sides such that the external electrodes are separated by a distance in a range of 30 μm to 200 μm and that each of the external electrodes includes a conductive paste layer connected to a respective group of the internal electrodes and a copper plated layer covering the conductive paste layer, and the conductive paste layer includes a Ni paste or a Cu paste including a glass component in a range of 5% to 40%.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

First Embodiment

Figure 1:
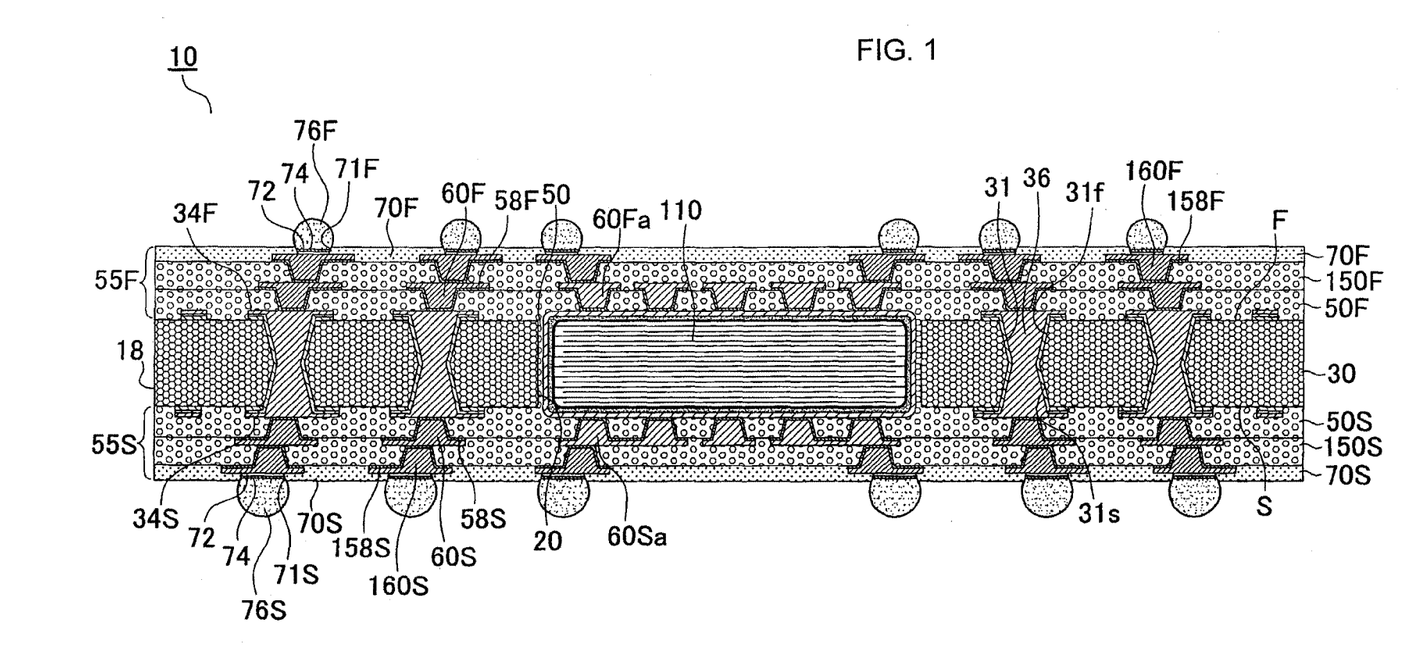
FIG. 1 illustrates a cross-sectional view of a substrate with a built-in capacitor according to a first embodiment of the present invention.

A cross section of a substrate 10 with a built-in capacitor according to a first embodiment of the present invention is illustrated in FIG. 1. The substrate 10 with the built-in capacitor has a core substrate 30 that has a first surface (F) and a second surface (S) that is on an opposite side of the first surface.

The core substrate 30 has a cavity (opening part) 20. In the present embodiment, the cavity 20 penetrates through the core substrate 30.

Inside the cavity 20, a capacitor 110 is accommodated. A resin 50 is filled in a spacing between a side wall of the cavity 20 and the capacitor 110. As a result, the capacitor 110 is fixed inside the cavity 20.

A conductor layer (34F) is formed on the first surface (F) of the core substrate 30, and a conductor layer (34S) is formed on the second surface (S) of the core substrate 30.

The core substrate 30 has multiple through holes 31, and inside each of the through holes 31, a through-hole conductor 36 connecting the conductor layers (34F, 34S) is formed.

The through-hole conductor 36 is formed by filling the through hole 31 by plating. The through hole 31 is formed by a first opening part (31*f*) that opens to the first surface (F) of the core substrate 30 and a second opening part (31*s*) that opens to the second surface (S). The first opening part (31*f*) is tapered from the first surface toward the second surface, and the second opening part (31*s*) is tapered from the second surface toward the first surface. The first opening part (31*f*) and the second opening part (31*s*) are connected inside the core substrate 30.

An upper side build-up layer (55F) is formed on the first surface (F) of the core substrate 30 and on the capacitor 110. The upper side build-up layer includes an insulating layer (50F) that is formed on the first surface (F) of the core substrate 30 and on the capacitor 110, a conductor layer (58F) on the insulating layer (50F), and a via conductor (60F) that is provided inside the insulating layer (50F) and connects the conductor layer (58F) and the conductor layer (34F). Inside the insulating layer (50F), a via conductor (60Fa) is further provided that connects the conductor layer (58F) and an electrode of the capacitor 110 (to be described later).

The upper side build-up layer (55F) further includes an insulating layer (150F) that is provided on the insulating layer (50F) and on the conductor layer (58F), a conductor pattern (158F) on the insulating layer (150F), and a via conductor (160F) that is provided inside the insulating layer (150F) and connects the conductor layer (58F) and the conductor pattern (158F).

A lower side build-up layer (55S) is formed on the second surface (S) of the core substrate 30 and on the capacitor 110. That is, a structure of the lower side build-up layer (55S) is the same as that of the upper side build-up layer (55F) and thus description thereof is omitted.

On the upper side build-up layer 55F, a solder resist layer (70F) having an opening (71F) is formed. On the lower side build-up layer (55S), a solder resist layer (70S) having an opening (71S) is formed. Conductor patterns (158F, 158S) that are exposed from the openings (71F, 71S) of the solder resist layers (70F, 70S) function as pads on which solder bumps (to be described later) are formed. On the pads, metal films (72, 74) such as those of Ni/Au or Ni/Pd/Au are formed, and on the metal films, solder bumps (76F, 76S) are formed. Via the solder bumps (76F) that are formed on the upper side build-up layer, an IC chip is mounted on the substrate 10 with the built-in capacitor. Via the solder bumps (76S) that are formed on the lower side build-up layer, the substrate 10 with the built-in capacitor is mounted on a motherboard.

Figure 7A:
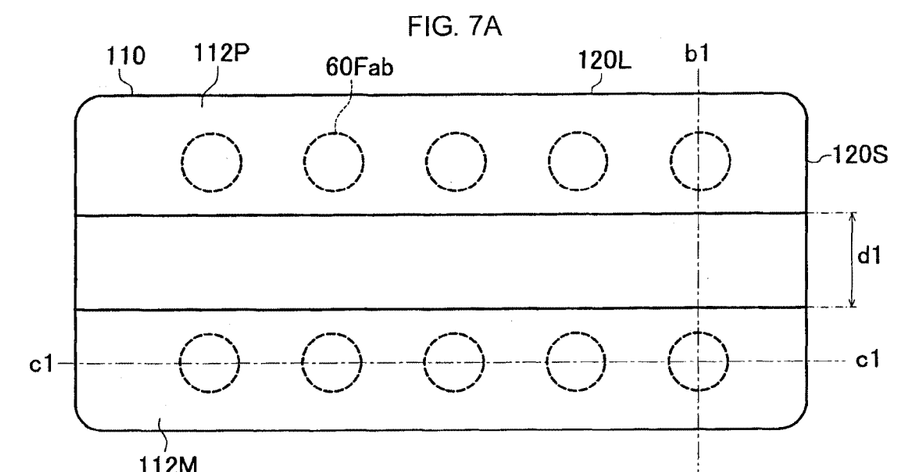
FIG. 7A-7C illustrate a plan view and cross-sectional views of the capacitor of the first embodiment.
Figure 7B:
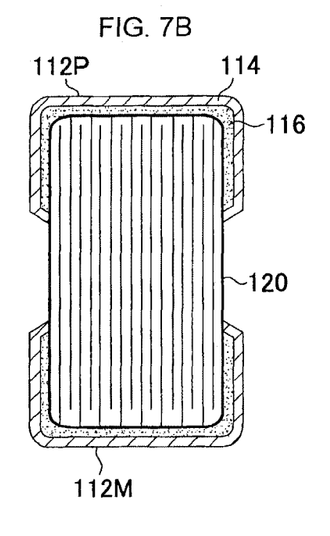
Figure 7C:
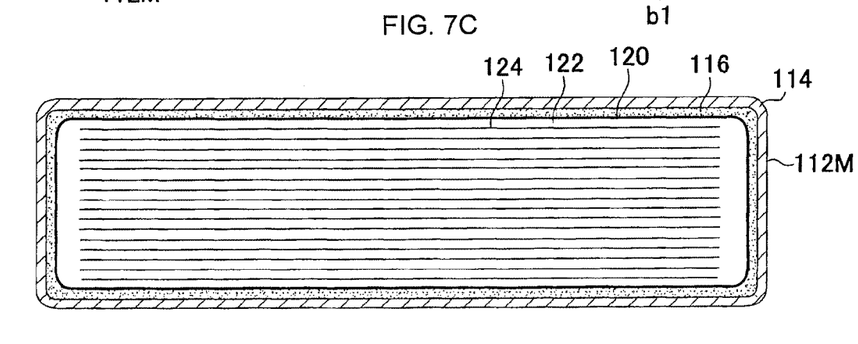

FIG. 7A illustrates a plan view of the capacitor that is built in the substrate with the built-in capacitor. FIG. 7B illustrates a b1-b1 cross section of FIG. 7A. FIG. 7C illustrates a c1-c1 cross section of FIG. 7A. FIG. 7C corresponds to the cross section of the capacitor in FIG. 1.

The capacitor 110 is formed from a multilayer ceramic capacitor (MLCC) of a small size and a large capacity. The capacitor includes a body part 120 and electrodes (112P, 112M), the body part 120 being formed by alternately laminating dielectric layers 122 that are formed mainly from $BaTiO_3$ and internal electrodes 124 that are made of Ni.

The body part 120 has a cuboid shape with long sides (120L) and short sides (120S). The laterally-long electrodes (112P, 112M) are provided on the long side (120L) sides. A distance (d1) between the electrode (112P) and the electrode (112M) is 70 μm or more and 150 μm or less. In the first embodiment, the electrodes (112P, 112M) are provided on the long sides (120L) of the cuboid shape. Therefore, the electrodes are elongated and, as illustrated by dashed lines in FIG. 7A, a bottom part (60Fab) of the via conductor (60Fa) can be connected at five places (see FIG. 1). That is, multiple via conductors can be connected to one electrode. Therefore, impedance of a power source wiring can be reduced.

On the other hand, as compared to a case where the electrodes are provided on the short sides, the distance between the electrodes is shorter even in a capacitor of the same size. Therefore, in the first embodiment, a Ni paste 116 is provided on each of the long side (120L) sides in a manner in contact with the internal electrodes 124 that extend to an end part of the body part 120 and the Ni paste 116 is covered by a Cu plating film 114 so that migration does not occur between the electrodes (112P, 112M) even when the distance is 150 μm or less.

FIG. 8A-8D illustrate a manufacturing process of the capacitor of the first embodiment.

Figure 8A:
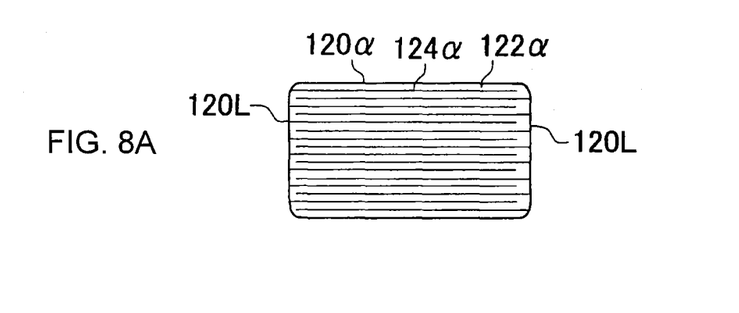
FIG. 8A-8D illustrate manufacturing process diagrams of the capacitor of the first embodiment.

(1) Dielectric layers (122α) that are formed from $BaTiO_3$ and internal electrode layers (124α) that are made of Ni are alternately laminated and a laminated body (120α) is formed (FIG. 8A).

Figure 8B:
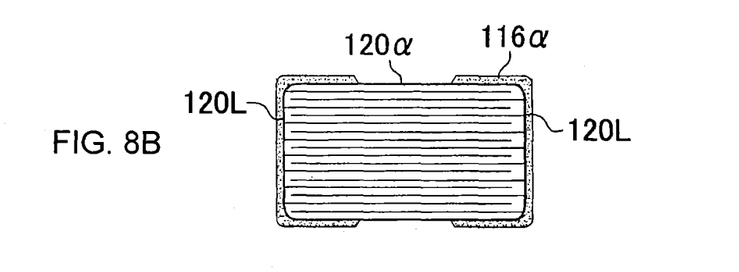

(2) A Ni paste layer (116α) is coated on each of the long side (120L) sides of the laminated body in a manner in contact with the internal electrode layers (124α) that extend to an end part of the laminated body (120α) (FIG. 8B). The Ni paste layer is mainly made of Ni powder and a titanium barium base component.

Figure 8C:
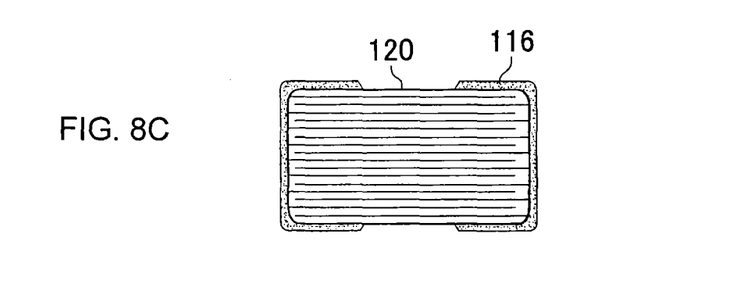

(3) The laminated body (120α) and the Ni paste layers (116α) are simultaneously fired, and the body part 120 and the Ni pastes 116 are formed (FIG. 8C).

Figure 8D:
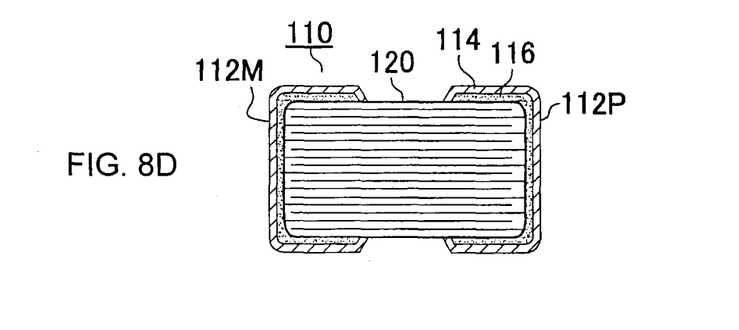

(4) By copper pyrophosphate plating using copper pyrophosphate ($Cu_7P_2O_7$) and potassium pyrophosphate ($K_4P_2O_7$), the Cu plating film 114 is coated on the Ni paste 116 and, after a water-washing step, the capacitor 110 is completed (FIG. 8D).

In the substrate with the built-in capacitor of the first embodiment, the built-in capacitor 110 is a multilayer ceramic capacitor of a large capacity. The capacitor has the cuboid shape with the long sides (120L) and the short sides (120S). The pair of the electrodes (112P, 112M) are provided on the opposing long side (120L) sides. Therefore, the electrodes each have a long length, and the multiple via conductors (60Fa) can be connected, and thus the impedance of the power source wiring can be reduced. Here, the distance between the electrodes (112P, 112M) is 150 μm or less. However, the electrodes are formed from the Ni pastes 116 that are connected to the internal electrodes of the capacitor body and the copper platings 114 that cover the conductive pastes. Even when the high adhesion copper pyrophosphate plating is used for the formation of the copper plating, since the Ni paste does not contain a glass component, even in a vacuum state when the capacitor is built in the substrate in a manufacturing process (to be described later), there is no scattering of potassium ions so that migration does not occur. Here, when the distance between the electrodes is less than 70 μm, an insulation distance is too short so that reliability is reduced. On the other hand, when the distance between the electrodes exceeds 150 μm, even when an existing conductive paste containing a glass component is used, migration is unlikely to occur.

In the method for manufacturing the substrate with the built-in capacitor of the first embodiment, the Ni paste layers (116α) are coated on the long sides of the laminated body (120α); the laminated body and the pastes are simultaneously fired; the Cu plating films 114 are respectively formed on the Ni pastes 116 by copper pyrophosphate plating to form the electrodes (112P, 112M); and the multilayer ceramic capacitor is completed. By the copper pyrophosphate plating, the Cu plating film 114 having high adhesion to the Ni paste 116 can be formed. In a process to be described later, the multilayer ceramic capacitor is accommodated in an opening of an insulating layer and, in a vacuum state, an interlayer resin insulating layer is laminated on the insulating layer. Therefore, adhesion between the insulating layer and the interlayer resin insulating layer is high. Here, the Ni paste is used, which does not contain a glass component. Therefore, even in a vacuum state when lamination is performed, there is no scattering of potassium ions so that migration does not occur. The via conductors (60Fa, 60Sa) that penetrate through the interlayer resin insulating layers (50F, 50S) and reach the electrodes are respectively formed with respect to the electrodes (112P, 112M). The electrodes are provided on the long sides of the laminated body. Therefore, the electrodes each have a long length and the multiple via conductors can be connected, and thus the impedance of the power source wiring can be reduced.

A method for manufacturing the substrate 10 with the built-in capacitor of the first embodiment is illustrated in FIG. 2A-6B.

Figure 2A:
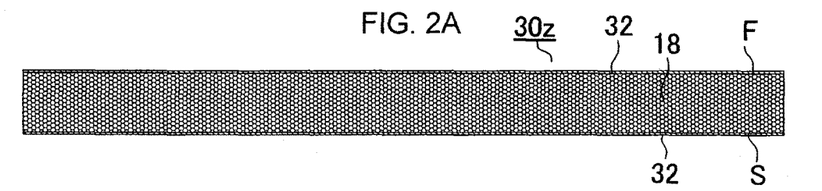
FIG. 2A-2F illustrate manufacturing process diagrams of the substrate with the built-in capacitor of the first embodiment.

(1) A double-sided copper-clad laminated plate (30z), which is formed from an insulating base material 18 and a copper foil 32 that is laminated on both sides of the insulating base material 18, is a starting material. The insulating base material has a first surface (F) and a second surface (S) that is on an opposite side of the first surface (F). A surface of the copper foil 32 is subjected to a blackening treatment (not illustrated in the drawings) (FIG. 2A).

Figure 2B:
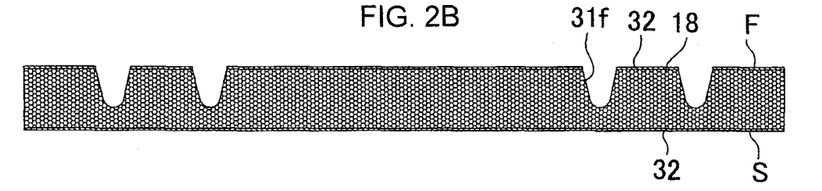

(2) Laser is irradiated to the first surface (F) side of the insulating base material 18. A first opening part (31f) that tapers from the first surface of the insulating base material toward the second surface is formed (FIG. 2B).

Figure 2C:
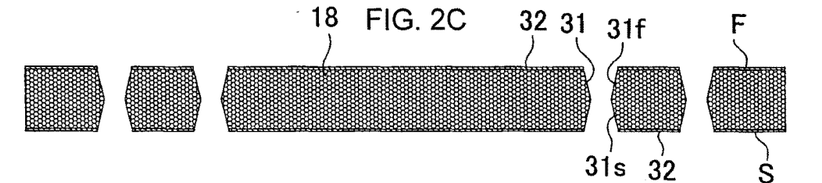

(3) Laser is irradiated to the second surface (S) side of the insulating base material 18. A second opening part (31s) that tapers from the second surface of the insulating base material toward the first surface is formed (FIG. 2C). The second opening part (31s) is connected to the first opening part (31f) inside the insulating base material, and a through hole 31 for a through-hole conductor is formed.

Figure 2D:
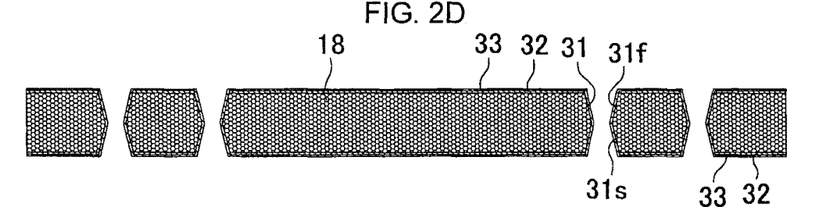

(4) By an electroless plating treatment, an electroless plating film 33 is formed on an inner wall of the through hole 31 and on the copper foil 32 (FIG. 2D).

Figure 2E:
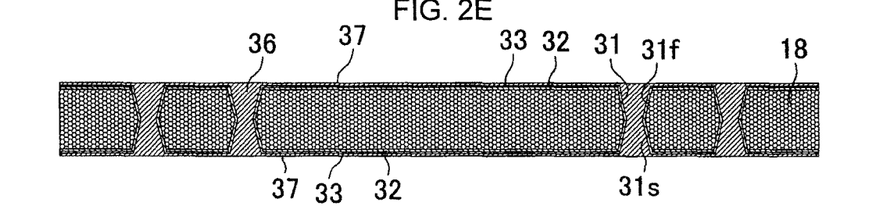

(5) By an electrolytic plating treatment, an electrolytic plating film 37 is formed on the electroless plating film 33. A through-hole conductor 36 is formed in the through hole. The through-hole conductor 36 is formed by the electroless plating film 33 that is formed on the inner wall of the through hole and the electrolytic plating film 37 that fills the through hole (FIG. 2E).

Figure 2F:
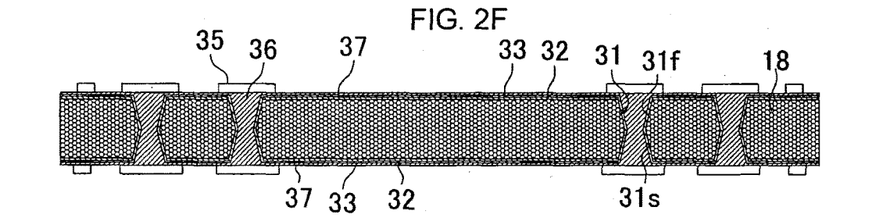

(6) An etching resist 35 of a predetermined pattern is formed on the electrolytic plating film 37 of the surface of the core substrate 30 (FIG. 2F).

Figure 3A:
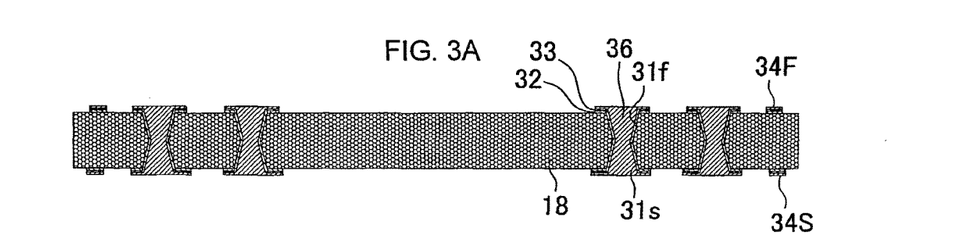
FIG. 3A-3E illustrate manufacturing process diagrams of the substrate with the built-in capacitor of the first embodiment.

(7) The electrolytic plating film 37, the electroless plating film 33 and the copper foil 32 that are exposed from the etching resist are removed. Thereafter, the etching resist is removed, and the conductor layers (34F, 34S) and the through-hole conductor 36 are formed (FIG. 3A).

Figure 3B:
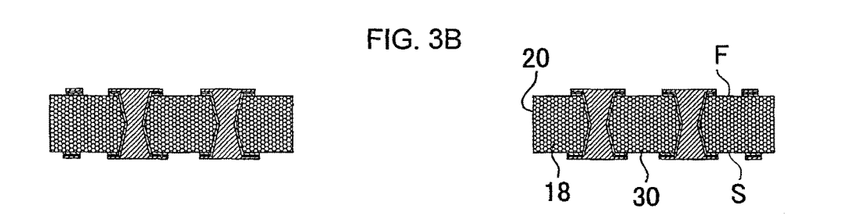

(8) At a central part of the insulating base material 18, an opening 20 for accommodating a capacitor is formed using laser, and the core substrate 30 is completed (FIG. 3B).

Figure 3C:
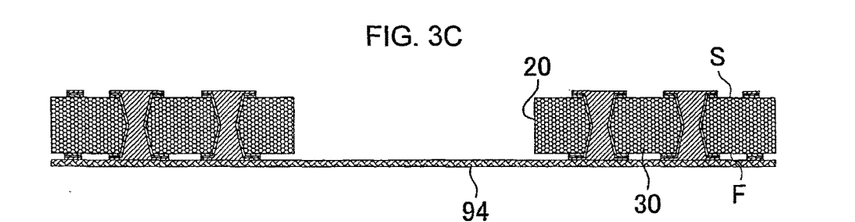

(9) A tape 94 is affixed to the second surface (S) of the core substrate 30. The opening 20 is closed by the tape (FIG. 3C). An example of the tape 94 is a PET film.

Figure 3D:
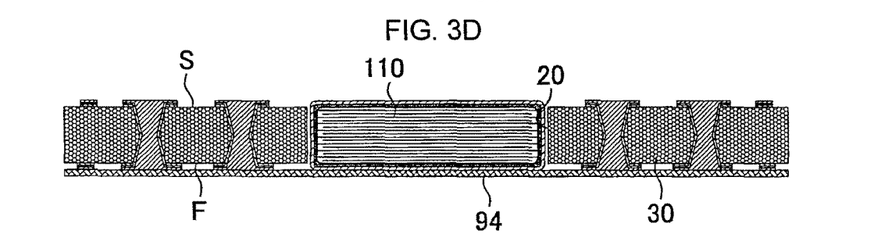

(10) On the tape 94 that is exposed by the opening 20, the capacitor 110 is placed (FIG. 3D). The capacitor accommodated in the opening 20 of the core substrate has a thickness of 30%-100% of that of the core substrate.

Figure 3E:
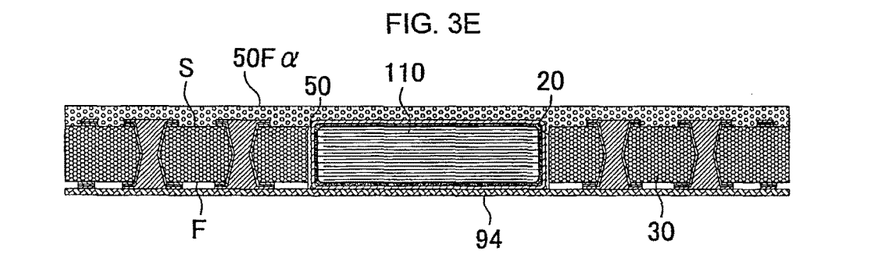

(11) Vacuuming is performed, and a prepreg (50Fα) of a B-stage is laminated on the first surface (F) of the core substrate 30. By hot pressing, resin seeps out from the prepreg into the opening, and the opening 20 is filled with a filler (resin filler) 50 (FIG. 3F). A spacing between an inner wall of the opening and the capacitor is filled with a filler. The capacitor is fixed on the core substrate. Instead of the prepreg, it is also possible that a resin film for an interlayer insulating layer is laminated. The prepreg has a reinforcing material such as a glass cloth. However, the resin film for an interlayer resin layer does not have a reinforcing material. It is preferable that both the prepreg and the resin film contain inorganic particles such as glass particles. The filler contains inorganic particles such as silica.

Figure 4A:
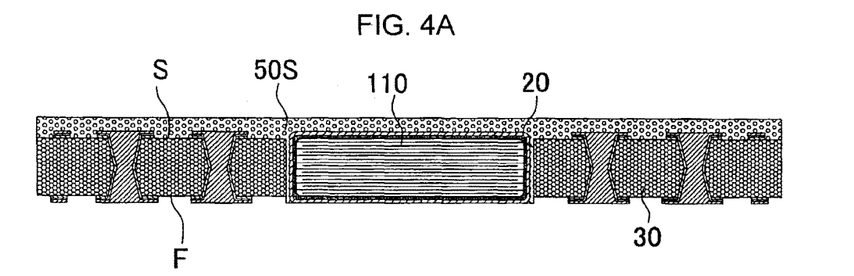
FIG. 4A-4D illustrate manufacturing process diagrams of the substrate with the built-in capacitor of the first embodiment.
Figure 4B:
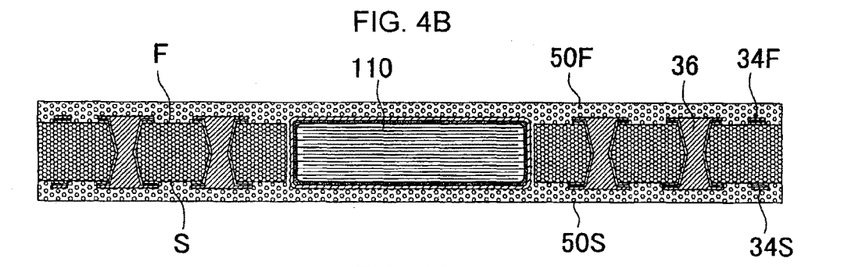

(12) After the tape is peeled off (FIG. 4A), vacuuming is performed, and a prepreg of a B-stage is laminated on the second surface (S) of the core substrate 30. The prepregs on the first surface and the second surface of the core substrate are cured. The insulating layers (interlayer resin insulating layers) (50F, 50S) are formed on the first surface and the second surface of the core substrate (FIG. 4B). Here, when the core substrate and the interlayer resin insulating layer are laminated, vacuuming is performed. Therefore, adhesion between the two is high. On the other hand, as described above, the Ni paste is used for the electrodes of the capacitor. Since the Ni paste does not contain a glass component, even in a vacuum state when the lamination is performed, there is no scattering of potassium ions so that it does not become a factor causing migration.

Figure 4C:
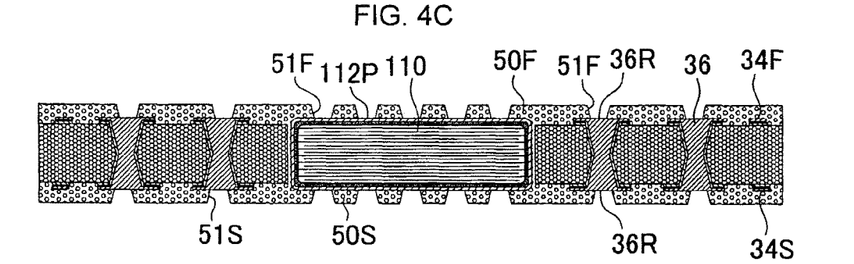

(13) Openings (51F) for via conductors reaching the electrodes (112P, 112M) (see FIG. 7A) of the capacitor 110, the conductor layer (34F) and the through-hole conductor 36 are formed on the insulating layer (50F) using CO2 gas laser from the first surface side. Openings (51S) for via conductors reaching the electrodes (112P, 112M) (see FIG. 7A) of the capacitor 110, the conductor layer (34S) and the through-hole conductor 36 are formed on the insulating layer (50S) from the second surface side (FIG. 4C). Rough surfaces (not illustrated in the drawings) are formed on the insulating layers (50F, 50S).

Figure 4D:
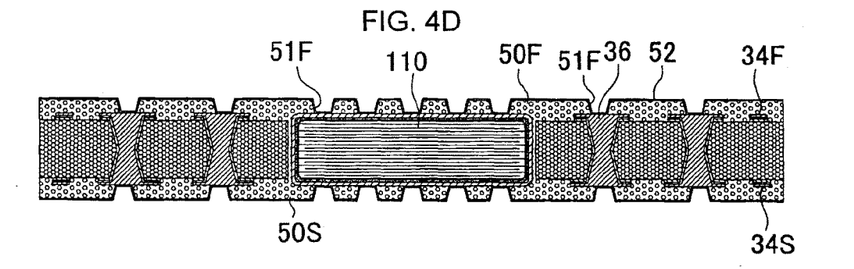

(14) By an electroless plating treatment, an electroless plating film 52 is formed on inner walls of the openings for the via conductors and on the insulating layers (FIG. 4D).

Figure 5A:
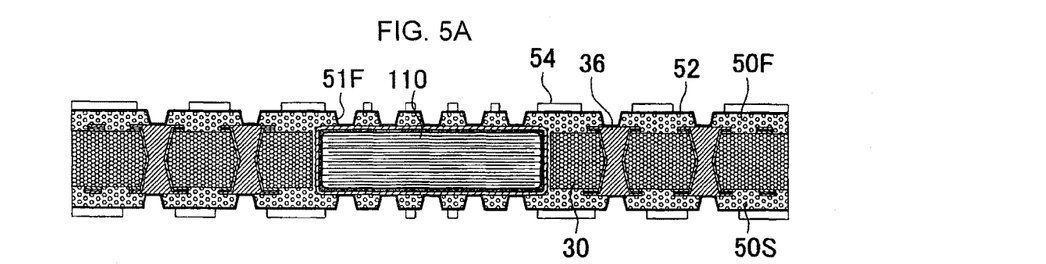
FIG. 5A-5D illustrate manufacturing process diagrams of the substrate with the built-in capacitor of the first embodiment.

(15) A plating resist 54 is formed on the electroless plating film 52 (FIG. 5A).

Figure 5B:
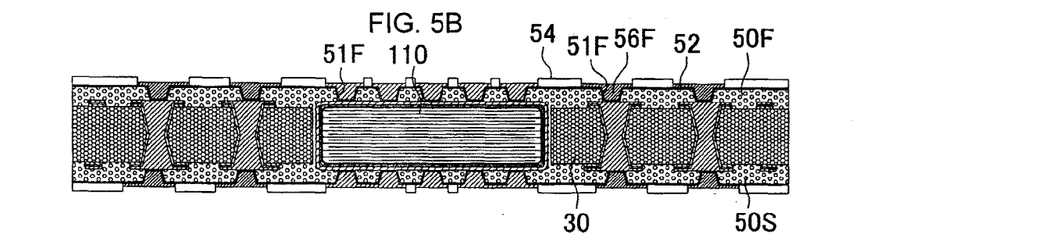

(16) Next, by an electrolytic plating treatment, an electrolytic plating film 56 is formed on the electroless plating film that is exposed from the plating resist (FIG. 5B).

Figure 5C:
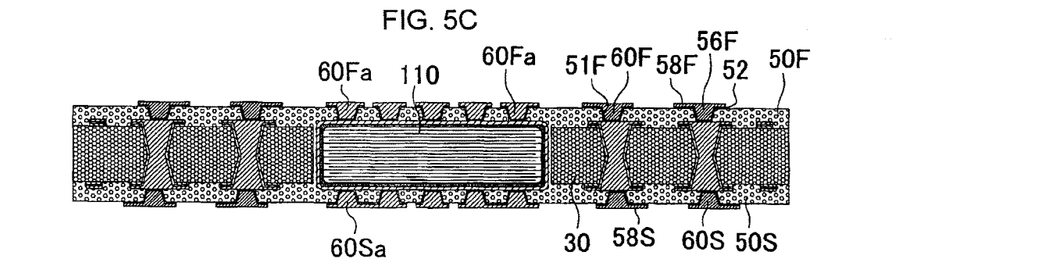
Figure 5D:
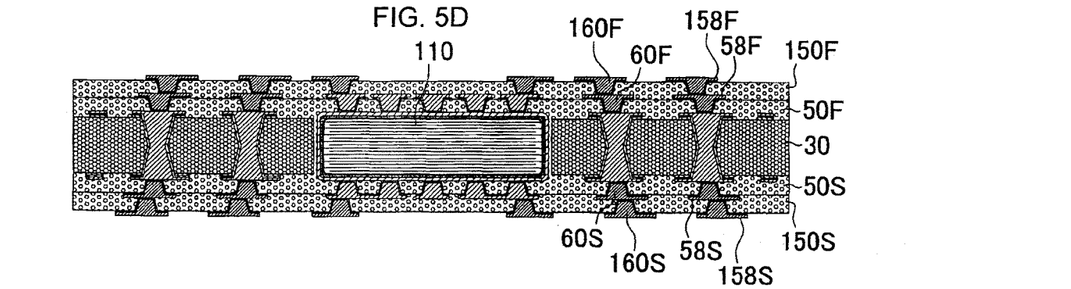

(17) Next, the plating resist 54 is removed using an amine solution. Thereafter, the electroless plating film 52 that is exposed from the electrolytic copper plating film is removed by etching, and the conductor layers (58F, 58S) that are formed from the electroless plating film 52 and the electrolytic plating film 56 are formed. The conductor layers (58F, 58S) include multiple conductor circuits and via conductor lands. At the same time, the via conductors (60F, 60S) and the connection via conductors (60Fa, 60Sa) are formed (FIG. 5C). The via conductors (60F, 60S) connect the conductor layer and the through-hole conductor of the core substrate to the conductor layers (58F, 58S) on the insulating layers. The connection via conductors (60Fa, 60Sa) connect the electrodes (112P, 112M) of the capacitor illustrated in FIG. 7A to the conductor layer (58F) on the insulating layer.

(18) The processes of the FIG. 4A-5C are repeated, and the uppermost and lowermost insulating layers (150F, 150S) are respectively formed on the insulating layers (50F, 50S). The conductor layers (158F, 158S) are respectively formed on the uppermost and lowermost insulating layers (150F, 150S). The via conductors (160F, 160S) are formed in the uppermost and lowermost insulating layers (150F, 150S). The conductor layers (58F, 58S) and the conductor layers (158F, 158S) are connected by the via conductors (160F, 160S) (FIG. 5D).

Figure 6A:
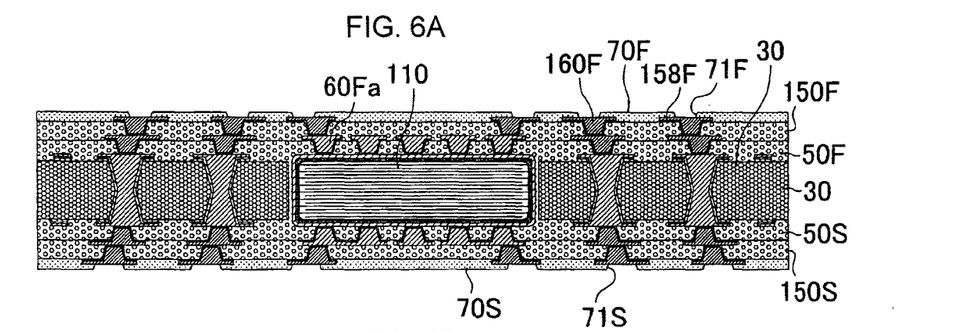
FIGS. 6A and 6B illustrate manufacturing process diagrams of the substrate with the built-in capacitor of the first embodiment.

(19) On the upper side build-up layer (55F), the solder resist layer (70F) having the openings (71F) is formed. On the lower side build-up layer (55S), the solder resist layer (70S) having the openings (71S) is formed (FIG. 6A). The openings (71F, 71S) expose upper surfaces of the conductor layers and the via conductors. The exposed portions function as pads.

Figure 6B:
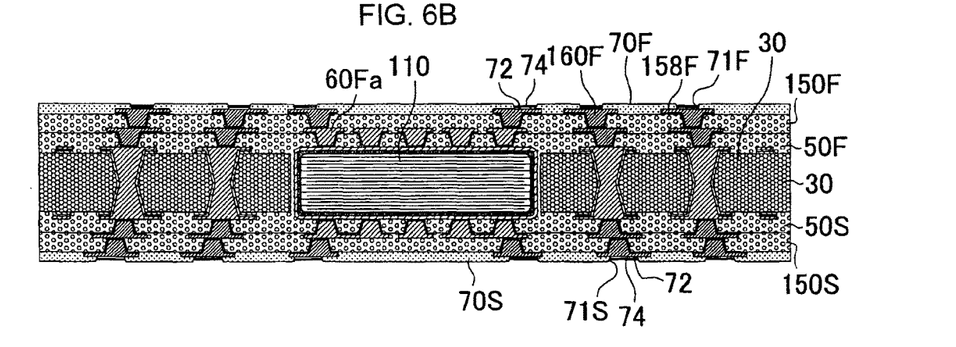

(20) On a pad, a metal film is formed that includes a nickel layer 72 and a gold layer 74 on the nickel layer 72 (FIG. 6B). Other than the nickel-gold layers, a metal film formed from nickel-palladium-gold layers may also be adopted.

(21) Thereafter, the solder bumps (76F) are formed on the pads of the upper side build-up layer (55F); and the solder bumps (76S) are formed on the pads of the lower side build-up layer (55S). The substrate 10 with the built-in capacitor having the solder bumps is completed (FIG. 1).

Via the solder bumps (76F), an IC chip (not illustrated in the drawings) is mounted on the substrate 10 with the built-in capacitor. Thereafter, via the solder bumps (76S), the substrate with the built-in capacitor is mounted on a motherboard.

Second Embodiment

A capacitor of a substrate with a built-in capacitor of a second embodiment is different from the capacitor of the first embodiment.

Figure 9A:
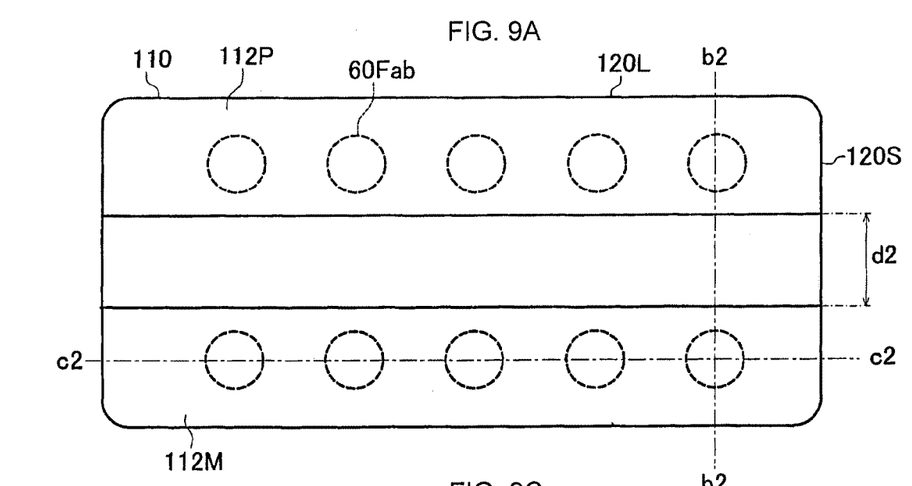
FIG. 9A-9C illustrate a plan view and cross-sectional views of a capacitor of a second embodiment.
Figure 9B:
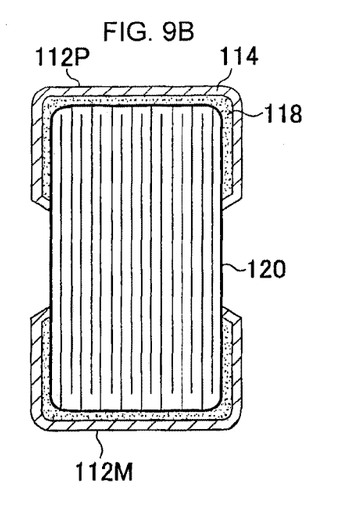
Figure 9C:
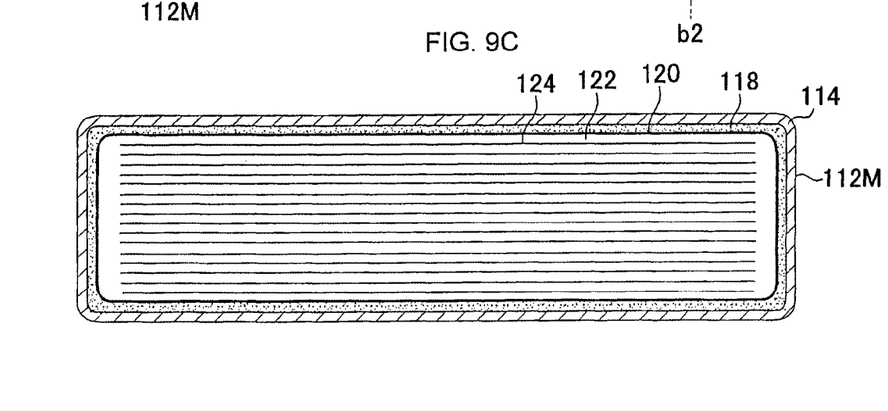

FIG. 9A illustrates a plan view of the capacitor that is built in the substrate with the built-in capacitor. FIG. 9B illustrates a b2-b2 cross section of FIG. 9A. FIG. 9C illustrates a c2-c2 cross section of FIG. 9A.

A capacitor 110 is formed from a multilayer ceramic capacitor (MLCC) of a small size and a large capacity. The capacitor includes a body part 120 and electrodes (112P, 112M), the body part 120 being formed by alternately laminating dielectric layers 122 that are formed mainly from $BaTiO_3$ and internal electrodes 124 that are made of Ni. The body part 120 has a cuboid shape with long sides (120L) and short sides (120S). The laterally-long electrodes (112P, 112M) are provided on the long side (120L) sides. A distance (d2) between the electrode (112P) and the electrode (112M) is 70 μm or more and 150 μm or less. In the second embodiment, the electrodes (112P, 112M) are provided on the long sides (120L) of the cuboid shape. Therefore, the electrodes are elongated and, as illustrated by dashed lines in FIG. 9A, the bottom part (60Fab) of the via conductor (60Fa) can be connected at five places. That is, multiple via conductors can be connected to one electrode. Therefore, the impedance of a power source wiring can be reduced.

On the other hand, as compared to the case where the electrodes are provided on the short sides, the distance between the electrodes is shorter even in a capacitor of the same size. Therefore, in the second embodiment, a Cu paste 118 is provided on each of the long side (120L) sides in a manner in contact with the internal electrodes 124 that extend to an end part of the body part 120 and the Cu paste 118 is covered by a Cu plating film 114 so that migration does not occur between the electrodes (112P, 112M) even when the distance is 150 μm or less.

FIG. 10A-10D illustrate a manufacturing process of the capacitor of the second embodiment.

Figure 10A:
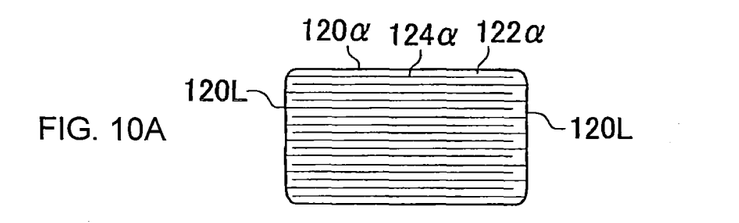
FIG. 10A-10D illustrate manufacturing process diagrams of the capacitor of the second embodiment.

(1) Dielectric layers (122α) that are formed from $BaTiO_3$ and internal electrode layers (124α) that are made of Ni are alternately laminated and a laminated body (120α) is formed (FIG. 10A).

Figure 10B:
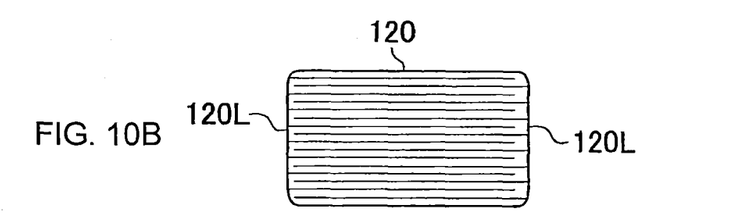

(2) The laminated body (120α) is fired and the body part 120 is formed (FIG. 10B).

Figure 10C:
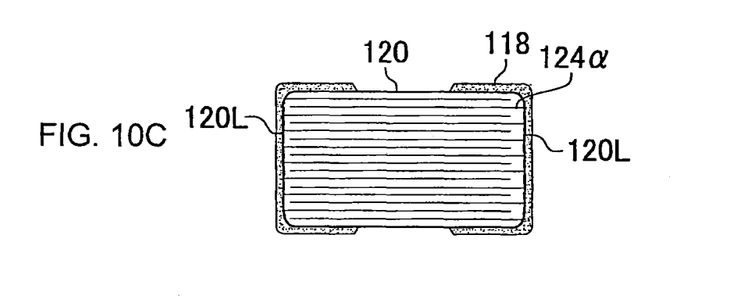

(3) The Cu paste layer 118 is coated on each of the long side (120L) sides of the laminated body in a manner in contact with the internal electrodes 124 that extend to an end part of the body part 120 (FIG. 10C). The Cu paste layer is mainly made of Cu powder and a glass component of 5-40%.

Figure 10D:
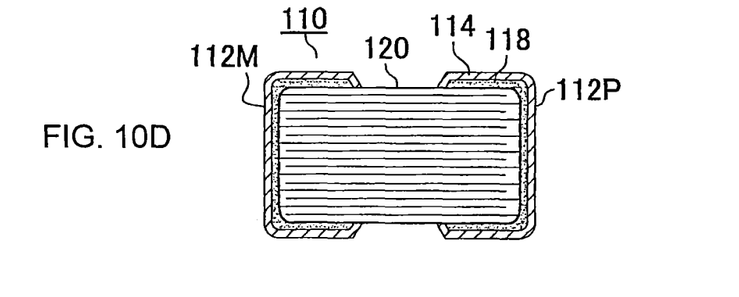

(4) By copper pyrophosphate plating using copper pyrophosphate ($Cu_7P_2O_7$) and potassium pyrophosphate ($K_4P_2O_7$), the Cu plating film 114 is coated on the Cu paste 118 and, after a water-washing step, the capacitor 110 is completed (FIG. 10D).

In the substrate with the built-in capacitor of the second embodiment, the built-in capacitor 110 is a multilayer ceramic capacitor of a large capacity. The capacitor has the cuboid shape with the long sides (120L) and the short sides (120S). The pair of the electrodes (112P, 112M) are provided on the opposing long side (120L) sides. Therefore, the electrodes each have a long length and the multiple via conductors (60Fa) can be connected, and thus the impedance of the power source wiring can be reduced. Here, the distance between the electrodes (112P, 112M) is 150 μm or less. However, the electrodes are each formed from the Cu paste 118 that is connected to the internal electrodes of the capacitor body and the copper plating 114 that covers the conductive paste. Even when the high adhesion copper pyrophosphate plating is used for the formation of the copper plating, since the Cu paste does not contain a glass component of 40% or more, even in a vacuum state when the capacitor is built in the substrate in a manufacturing process, a scattering amount of potassium ions is small and does not become a factor causing migration. When the glass component in the Cu paste is less than 5%, adhesion between the Cu paste and the dielectric layers that are formed from $BaTiO_3$ in the multilayer ceramic capacitor is reduced.

Modified Embodiment of Second Embodiment

Figure 11A:
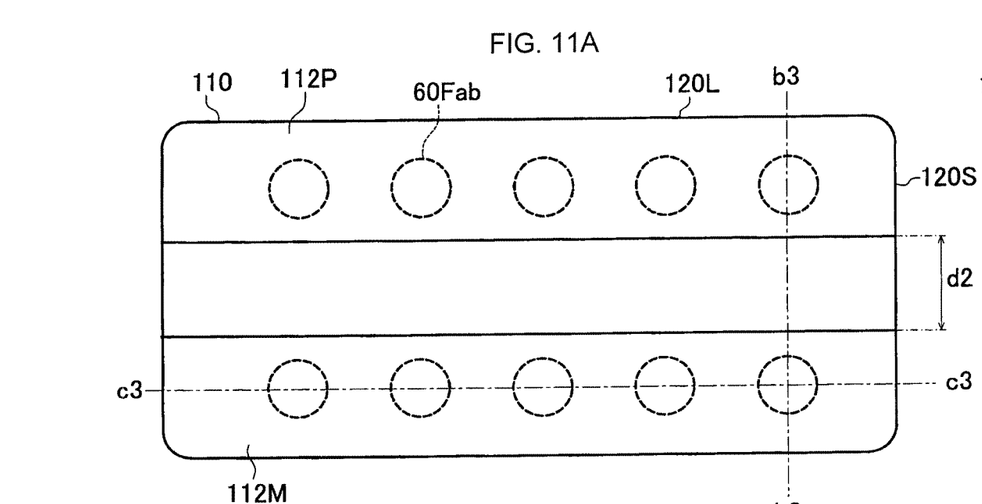
FIG. 11A-11C illustrate a plan view and cross-sectional views of a capacitor according to a modified embodiment of the second embodiment.
Figure 11B:
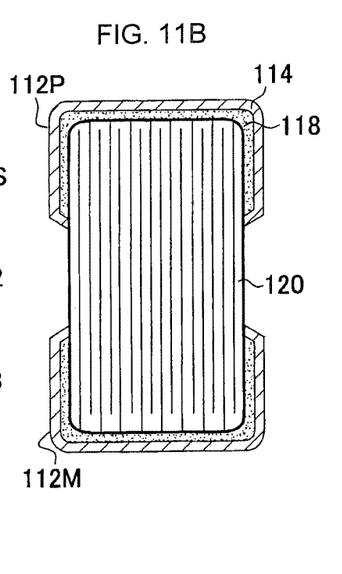
Figure 11C:
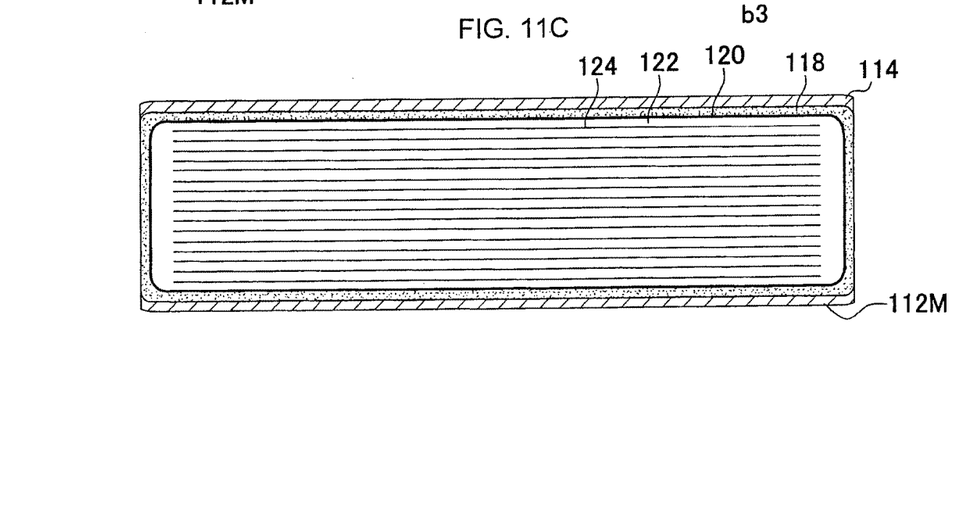

FIG. 11A-11C illustrate a capacitor of a substrate with a built-in capacitor according to a modified embodiment of the second embodiment.

FIG. 11A illustrates a plan view of the capacitor that is built in the substrate with the built-in capacitor. FIG. 11B illustrates a b3-b3 cross section of FIG. 11A. FIG. 11C illustrates a c3-c3 cross section of FIG. 11A. In the modified embodiment of the second embodiment, the Cu paste 118 on lateral sides of the capacitor is not covered by the Cu plating film 114.

In a package substrate or the like for mounting a CPU, in order to enhance supply power to the CPU, a chip capacitor or the like may be surface-mounted. To shorten a wiring length between the CPU and the chip capacitor and further to stabilize a voltage of the supply power, a chip capacitor may be built in the package substrate.

In a case where a chip capacitor in which a metalized film is removed, a Cu paste containing a glass component is directly provided on a capacitor body and a Cu plating film is provided on the Cu paste is built in a substrate with a built-in capacitor, test results have revealed that migration occurs between two electrodes when a distance between the electrodes is 150 μm or less.

In the case where the Cu paste containing a glass component is used, pores originating from the glass component are formed on a surface of the Cu paste. When high adhesion copper pyrophosphate plating is formed on the Cu paste, potassium ions remain in the pores. During lamination of an interlayer resin insulating layer on the chip capacitor, when a vacuum state is achieved in order to enhance adhesion, the potassium ions are drawn out from the pores and are scattered and adhere to a surface of the capacitor between the electrodes. The migration occurs due to the potassium ions.

In a substrate with a built-in capacitor according to an embodiment of the present invention, migration does not occur between electrodes of the capacitor, and another embodiment of the present invention is a method for manufacturing such a substrate with the built-in capacitor.

A substrate with a built-in capacitor according to an embodiment of the present invention is formed by laminating a conductor layer and an insulating layer on an insulating base material, and a capacitor is built in the insulating base material. The capacitor is a multilayer ceramic capacitor that is formed by alternately laminating internal electrodes and ceramic dielectric layers and is provided with a pair of external electrodes. The capacitor has a cuboid shape with long sides and short sides, and the pair of the external electrodes are provided on opposing long-side sides. A distance between the pair of the external electrodes is 30 μm or more and 200 μm or less. The external electrodes are each formed from a conductive paste that is connected to the internal electrodes and a copper plating that covers the conductive paste. The conductive paste is a Ni paste or a Cu paste, the Cu paste containing a glass component of 5-40%.

A method for manufacturing a substrate with a built-in capacitor according to an embodiment of the present invention includes: forming a laminated body in a cuboid shape with long sides and short sides by laminating a dielectric paste and internal electrodes; coating a Ni paste on long sides of the laminated body; simultaneously firing the laminated body and the Ni paste; forming a Cu plating film on the Ni paste by copper pyrophosphate plating to form external electrodes and thereby completing a multilayer ceramic capacitor; accommodating the multilayer ceramic capacitor in an opening of an insulating layer; laminating an interlayer resin insulating layer on the insulating layer in a vacuum state; and forming multiple via conductors that penetrate through the interlayer resin insulating layer and reach the electrodes with respect to each of the electrodes.

A capacitor that is built in the substrate with the built-in capacitor according to an embodiment of the present invention is a multilayer ceramic capacitor of a large capacity. The capacitor has a cuboid shape with long sides and short sides. The pair of the electrodes is provided on the opposing long-side sides. Therefore, the electrodes each have a long length, and multiple via conductors can be connected and thus impedance of a power source wiring can be reduced. Here, a distance between the electrodes is 150 μm or less. However, the electrodes are each formed from a conductive paste that is connected to the internal electrodes of the capacitor body and copper plating that covers the conductive paste. The conductive paste is formed from a Ni paste. Even when high adhesion copper pyrophosphate plating is used for the formation of the copper plating, since a glass component is not contained, even in a vacuum state when the capacitor is built in the substrate, there is no scattering of potassium ions so that migration does not occur. Here, when the distance between the electrodes is less than 70 an insulation distance is too short so that reliability is reduced. Further, even when the Cu paste is used as the conductive paste, by keeping the glass component to 5-40%, scattering of potassium ions can be suppressed.

In a method for manufacturing the substrate with the built-in capacitor according to an embodiment of the present invention, the Ni paste is coated on the long sides of the laminated body; the laminated body and the paste are simultaneously fired; the Cu plating film is formed on the Ni paste by copper pyrophosphate plating to form the electrodes; and the multilayer ceramic capacitor is completed. By the copper pyrophosphate plating, the Cu plating film having high adhesion to the Ni paste can be formed. The multilayer ceramic capacitor is accommodated in an opening of the insulating layer and in vacuum state the interlayer resin insulating layer is laminated on the insulating layer. Therefore, adhesion between the insulating layer and the interlayer resin insulating layer is high. Here, the conductive paste is formed from the Ni paste and does not contain a glass component. Therefore, even in a vacuum state when lamination is performed, there is no scattering of potassium ions so that migration does not occur. The multiple via conductors that penetrate through the interlayer resin insulating layer and reach the electrodes are formed with respect to each of the electrodes. The electrodes are provided on the long sides of the laminated body. Therefore, the electrodes each have a long length and the multiple via conductors can be connected, and thus the impedance of the power source wiring can be reduced.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate with a built-in capacitor, comprising:
   an insulating base material layer;
   a build-up layer formed on the insulating base material layer and comprising a conductor layer and an insulating layer; and
   a multilayer ceramic capacitor positioned in an opening portion of the insulating base material layer and comprising a plurality of internal electrodes, a plurality of ceramic dielectric layers and a pair of external electrodes,
   wherein the multilayer ceramic capacitor has a cuboid shape having long sides and short sides, the pair of external electrodes is formed on opposing long-side sides such that the external electrodes are separated by a distance in a range of 30 μm to 200 μm and that each of the external electrodes comprises a conductive paste layer connected to a respective group of the internal electrodes and a copper plated layer covering the conductive paste layer, the conductive paste layer comprises one of a Ni paste and a Cu paste including a glass component in a range of 5% to 40%, and the build-up layer has a plurality of first via conductors and a plurality of second via conductors such that the first via conductors are connected to one of the external electrodes of the multilayer ceramic capacitor and the second via conductors are connected to the other one of the external electrodes of the multilayer ceramic capacitor.

2. A substrate with a built-in capacitor according to claim 1, wherein the copper plated layer comprises copper pyrophosphate plating.

3. A substrate with a built-in capacitor according to claim 2, wherein the insulating base material layer forms a core substrate having a coefficient of thermal expansion in an X-Y direction which is lower than a coefficient of thermal expansion of the multilayer ceramic capacitor in the X-Y direction.

4. A substrate with a built-in capacitor according to claim 3, further comprising:
   a second build-up layer formed on the insulating base material layer on an opposite side with respect to the build-up layer,
   wherein the build-up layer has a plurality of via conductors connected to the external electrodes of the multilayer ceramic capacitor, and the second build-up layer has a plurality of via conductors connected to the external electrodes of the multilayer ceramic capacitor on the opposite side with respect to the build-up layer.

5. A substrate with a built-in capacitor according to claim 3, further comprising:
   a second build-up layer formed on the insulating base material layer on an opposite side with respect to the build-up layer,
   wherein the build-up layer has a plurality of pads formed such that the plurality of pads in the build-up layer is positioned to mount an IC chip on the build-up layer, and the second build-up layer has a plurality of pads formed such that the plurality of pads in the second build-up layer is positioned to mount a motherboard on the second build-up layer.

6. A substrate with a built-in capacitor according to claim 2, further comprising:
   a second build-up layer formed on the insulating base material layer on an opposite side with respect to the build-up layer,
   wherein the build-up layer has a plurality of via conductors connected to the external electrodes of the multilayer ceramic capacitor, and the second build-up layer has a plurality of via conductors connected to the external electrodes of the multilayer ceramic capacitor on the opposite side with respect to the build-up layer.

7. A substrate with a built-in capacitor according to claim 2, further comprising:
   a second build-up layer formed on the insulating base material layer on an opposite side with respect to the build-up layer,
   wherein the build-up layer has a plurality of pads formed such that the plurality of pads in the build-up layer is positioned to mount an IC chip on the build-up layer, and the second build-up layer has a plurality of pads formed such that the plurality of pads in the second build-up layer is positioned to mount a motherboard on the second build-up layer.

8. A substrate with a built-in capacitor according to claim 1, wherein the insulating base material layer forms a core substrate having a coefficient of thermal expansion in an X-Y direction which is lower than a coefficient of thermal expansion of the multilayer ceramic capacitor in the X-Y direction.

9. A substrate with a built-in capacitor according to claim 8, further comprising:
   a second build-up layer formed on the insulating base material layer on an opposite side with respect to the build-up layer,
   wherein the build-up layer has a plurality of via conductors connected to the external electrodes of the multilayer ceramic capacitor, and the second build-up layer has a plurality of via conductors connected to the external electrodes of the multilayer ceramic capacitor on the opposite side with respect to the build-up layer.

10. A substrate with a built-in capacitor according to claim 8, further comprising:
    a second build-up layer formed on the insulating base material layer on an opposite side with respect to the build-up layer,
    wherein the build-up layer has a plurality of pads formed such that the plurality of pads in the build-up layer is positioned to mount an IC chip on the build-up layer, and the second build-up layer has a plurality of pads formed such that the plurality of pads in the second build-up layer is positioned to mount a motherboard on the second build-up layer.

11. A substrate with a built-in capacitor according to claim 1, further comprising:
    a second build-up layer formed on the insulating base material layer on an opposite side with respect to the build-up layer,
    wherein the build-up layer has a plurality of via conductors connected to the external electrodes of the multilayer ceramic capacitor, and the second build-up layer has a plurality of via conductors connected to the external electrodes of the multilayer ceramic capacitor on the opposite side with respect to the build-up layer.

12. A substrate with a built-in capacitor according to claim 11, wherein the build-up layer has a plurality of pads formed such that the plurality of pads in the build-up layer is positioned to mount an IC chip on the build-up layer, and the second build-up layer has a plurality of pads formed such that the plurality of pads in the second build-up layer is positioned to mount a motherboard on the second build-up layer.

13. A substrate with a built-in capacitor according to claim 1, wherein the conductive paste layer comprises the Ni paste formed by firing a paste comprising Ni powder and a titanium barium base component.

14. A substrate with a built-in capacitor according to claim 1, wherein the plurality of ceramic dielectric layers comprises $BaTiO_3$.

15. A substrate with a built-in capacitor according to claim 1, further comprising:
    a second build-up layer formed on the insulating base material layer on an opposite side with respect to the build-up layer,
    wherein the build-up layer has a plurality of pads formed such that the plurality of pads in the build-up layer is positioned to mount an IC chip on the build-up layer, and the second build-up layer has a plurality of pads formed such that the plurality of pads in the second build-up layer is positioned to mount a motherboard on the second build-up layer.

16. A substrate with a built-in capacitor according to claim 1, wherein the conductive paste layer comprises the Ni paste formed by firing a paste comprising Ni powder and a titanium barium base component, and the plurality of ceramic dielectric layers comprises $BaTiO_3$.

17. A method for manufacturing a substrate with a built-in capacitor, comprising:
    preparing a multilayer ceramic capacitor comprising a plurality of internal electrodes, a plurality of ceramic dielectric layers and a pair of external electrodes;

positioning the multilayer ceramic capacitor in an opening portion of an insulating base material layer; and forming on the insulating base material layer a build-up layer comprising a conductor layer and an insulating layer, wherein the multilayer ceramic capacitor has a cuboid shape having long sides and short sides, the pair of external electrodes is formed on opposing long-side sides such that the external electrodes are separated by a distance in a range of 30 μm to 200 μm and that each of the external electrodes comprises a conductive paste layer connected to a respective group of the internal electrodes and a copper plated layer covering the conductive paste layer, the conductive paste layer comprises one of a Ni paste and a Cu paste including a glass component in a range of 5% to 40%, and the forming of the build-up layer includes forming a plurality of first via conductors and a plurality of second via conductors such that the first via conductors are connected to one of the external electrodes of the multilayer ceramic capacitor and the second via conductors are connected to the other one of the external electrodes of the multilayer ceramic capacitor.

18. A method for manufacturing a substrate with a built-in capacitor according to claim 17, wherein the preparing of the multilayer ceramic capacitor includes laminating a plurality of dielectric paste layers and the plurality of internal electrodes such that a laminated body comprising the dielectric paste layers and the internal electrodes in a cuboid shape having long sides and short sides is formed, coating one of the Ni paste and the Cu paste on the opposing long sides of the laminated body, simultaneously firing the laminated body and the one of the Ni paste and the Cu paste coated on the laminated body, and applying copper pyrophosphate plating on the one of the Ni paste and the Cu paste such that the pair of external electrodes each comprising the conductive paste layer and the copper plated layer is formed, and the forming of the build-up layer includes laminating the insulating layer on the insulating base material layer in vacuum state.

19. A method for manufacturing a substrate with a built-in capacitor according to claim 17, wherein the insulating base material layer forms a core substrate having a coefficient of thermal expansion in an X-Y direction which is lower than a coefficient of thermal expansion of the multilayer ceramic capacitor in the X-Y direction.

20. A method for manufacturing a substrate with a built-in capacitor according to claim 17, further comprising:

forming a second build-up layer on the insulating base material layer on an opposite side with respect to the build-up layer, wherein the forming of the second build-up layer includes forming a plurality of via conductors connected to the external electrodes of the multilayer ceramic capacitor on the opposite side with respect to the build-up layer.

* * * * *